United States Patent
Chang et al.

(10) Patent No.: US 9,170,292 B2
(45) Date of Patent: Oct. 27, 2015

(54) INSULATION DETECTION CIRCUIT AND METHOD THEREOF

(71) Applicant: SIMPLO TECHNOLOGY CO., LTD., Hsinchu County (TW)

(72) Inventors: Ya-Mei Chang, Taoyuan County (TW); Ruei-Yan Dai, Kaohsiung (TW); Yu-Ju Lin, Taipei (TW)

(73) Assignee: SIMPLO TECHNOLOGY CO., LTD., Hsinchu County (TW)

( * ) Notice: Subject to any disclaimer, the term of this patent is extended or adjusted under 35 U.S.C. 154(b) by 137 days.

(21) Appl. No.: 13/840,699

(22) Filed: Mar. 15, 2013

(65) Prior Publication Data

US 2014/0145726 A1    May 29, 2014

(30) Foreign Application Priority Data

Nov. 28, 2012  (TW) .............................. 101144597 A

(51) Int. Cl.
| | |
|---|---|
| G01R 31/00 | (2006.01) |
| G01R 31/14 | (2006.01) |
| G01R 31/28 | (2006.01) |
| G01R 31/02 | (2006.01) |

(52) U.S. Cl.
CPC .............. *G01R 31/025* (2013.01); *G01R 31/02* (2013.01); *G01R 31/006* (2013.01); *G01R 31/2829* (2013.01)

(58) Field of Classification Search
CPC ...... G01R 31/02; G01R 31/08; G01R 31/025; G01R 31/006; G01R 31/2829; B60L 2250/10; B60L 11/003; B60L 11/1803; B60L 3/0069; B60L 3/0046; B60L 3/04; B60L 1/02; Y02T 10/70; Y02T 10/7005

USPC ........ 324/500–522; 607/57; 361/42; 340/650
See application file for complete search history.

(56) References Cited

U.S. PATENT DOCUMENTS

| | | | | |
|---|---|---|---|---|
| 5,481,194 | A  * | 1/1996 | Schantz et al. ................. | 324/522 |
| 5,945,802 | A  * | 8/1999 | Konrad et al. ................. | 318/807 |
| 7,486,491 | B2 * | 2/2009 | Suzuki et al. ................... | 361/42 |
| 2009/0314073 | A1* | 12/2009 | Perryman et al. .......... | 73/114.45 |
| 2010/0244850 | A1* | 9/2010 | Yano et al. ..................... | 324/510 |
| 2010/0308841 | A1* | 12/2010 | Karrer et al. .................. | 324/551 |
| 2011/0194871 | A1* | 8/2011 | Matsumoto ..................... | 399/88 |
| 2013/0002262 | A1* | 1/2013 | Tago et al. ..................... | 324/503 |
| 2014/0002038 | A1* | 1/2014 | Hsu ................................. | 323/271 |
| 2014/0103939 | A1* | 4/2014 | Chatroux et al. ............. | 324/551 |

FOREIGN PATENT DOCUMENTS

WO    WO 2012164073 A1 * 12/2012

* cited by examiner

*Primary Examiner* — Melissa Koval
*Assistant Examiner* — Felicia Farrow
(74) *Attorney, Agent, or Firm* — Li & Cai Intellectual Property (USA) Office

(57) ABSTRACT

An insulation detection circuit suitable for detecting an insulation status between a high voltage power and a low voltage power of a vehicle is disclosed. The circuit includes a first energy storage unit, a second energy storage unit, a constant current unit, and a detection unit. The first energy storage unit is coupled to the high voltage power. The second energy storage unit is coupled between the first energy storage unit and the low voltage power. The constant current unit is coupled between the first energy storage unit and the second energy storage unit. The detection unit is coupled to the second energy storage unit for detecting a current change of the second energy storage unit. When the detection unit detects that current flowing through the second energy storage unit is smaller than a predetermined value, a detection signal representing that the insulation status is abnormal is outputted.

17 Claims, 9 Drawing Sheets

INSULATION DETECTION CIRCUIT AND METHOD THEREOF

BACKGROUND OF THE INVENTION

1. Field of the Invention

The present disclosure relates to an insulation detection circuit and method thereof; in particular, to an insulation detection circuit and method thereof which are applied between a high voltage power and a low voltage power of a vehicle.

2. Description of Related Art

According to the progress of the technology, the transportation vehicle is provided with versatile electric instruments such as the illumination lights, the electromotive windows, the digital video/audios, the navigation systems, or the isothermal air conditioners, etc. Those electric instruments are operated by using the power supplied from the battery, the electricity generator, or the high voltage to low voltage converter. Of course, there needs a good insulation between the high voltage power and the low voltage power of the vehicle, for making people use versatile electric instruments safely.

However, the progression of the vehicle goes toward the hybrid vehicles or electric vehicles of green energy industry, and the electric vehicle may output a high voltage of about 60 to 600 volts by means of, for example, a driving chain including the high voltage battery and the high voltage to low voltage converter. However, the high voltage exceeding 60 volts is considered to be harmful to people.

When the insulation between the high voltage power and the low voltage power of the vehicle is damaged, the current may leak to the chassis or the shell of the vehicle, thus the chassis or the shell of the vehicle may contain the charges which are harmful to human body. If the user touches any part of the chassis or shell of the vehicle, the user may be hurted by electric shocks.

For example, when the vehicle is subject to strong vibrations, thus the insulation body is abraded or cracked mechanically, such as the insulation body damage of the high voltage cable of the vehicle. Thus, the current of the high voltage power may leak to the shell of the vehicle. For warning the user, driver, and passenger of the vehicle about the leakage current caused by the damaged insulation body, the vehicle needs to be installed with the insulation detection circuits for detecting the condition of damaged insulation which may happen.

Therefore, the abnormal insulation status between the high voltage power and the low voltage power of the vehicle is a serious problem which needs to be detected, for ensuring the safety of the people who may touch the vehicle. Thus, how to improve the accuracy of the insulation detection circuits during operation is an important topic.

SUMMARY OF THE INVENTION

The present disclosure provides an insulation detection circuit. The circuit uses a constant current unit to provide a stable constant current for charging/discharging a second energy storage unit, and when the current of the second energy storage unit is smaller than a predetermined value, a detection unit may precisely detect that the insulation between the high voltage power and the low voltage power of the vehicle is damaged. Therefore, the present disclosure can enhance the usage convenience of the insulation detection circuit.

The present disclosure provides an insulation detection circuit suitable for detecting an insulation status between a high voltage power and a low voltage power of a vehicle. The insulation detection circuit includes a first energy storage unit, a second energy storage unit, a constant current unit, and a detection unit. The first energy storage unit is coupled to a high voltage power. The second energy storage unit is coupled between the first energy storage unit and a low voltage power. The constant current unit is coupled between the first energy storage unit and the second energy storage unit, and provides a constant current for charging/discharging the second storage unit. The detection unit is coupled to the second energy storage unit for detecting a current change of the second energy storage unit. When the detection unit detects that the current flowing through the second energy storage unit is smaller than a predetermined value, the detection unit then outputs a detection signal representing that the insulation status is abnormal.

The present disclosure provides an insulation detection method suitable for detecting an insulation status between a high voltage power and a low voltage power of a vehicle. The insulation detection method includes: providing a first energy storage unit coupled to the high voltage power; providing a second energy storage unit coupled between the first energy storage unit and a low voltage power; providing a constant current for charging/discharging the second energy storage unit; detecting a current change of the current flowing through the second energy storage unit; and when detecting that the current flowing through the second energy storage unit is smaller than a predetermined value, a detection signal representing the abnormity of the insulation status is outputted.

The present disclosure provides an insulation detection circuit suitable for detecting an insulation status between a high voltage power and a low voltage power of a vehicle. The insulation detection circuit includes a first energy storage unit, an impedance unit, a constant current unit, and a detection unit. The first energy storage unit is coupled to the high voltage power. The impedance unit is coupled between the first energy storage unit and a low voltage power. The constant current unit is coupled between the first energy storage unit and the impedance unit, and provides a constant current to pass through the impedance unit. The detection unit is coupled to the impedance unit, for detecting a current change of the current flowing through the impedance unit. When the detection unit detects that the current flowing through the impedance unit is smaller than a predetermined value, the detection unit then outputs a detection signal representing that the insulation status is abnormal.

On the basis of the above, the insulation detection circuit of this disclosure uses the constant current unit for providing a stable constant current to the second energy storage unit. When the current flowing through the second energy storage unit is smaller than a predetermined value, the detection unit may precisely detect that the insulation between the high voltage power and the low voltage power of the vehicle is damaged. Therefore, the present disclosure is able to enhance the usage convenience of the insulation detection circuits.

For further understanding of the present disclosure, reference is made to the following detailed description illustrating the embodiments and examples of the present disclosure. The description is only for illustrating the present disclosure and not for limiting the scope of the claim.

BRIEF DESCRIPTION OF THE DRAWINGS

The drawings included herein provide further understanding of the present disclosure. A brief introduction of the drawings is as follows.

DETAILED DESCRIPTION OF THE PREFERRED EMBODIMENTS

Figure 1:
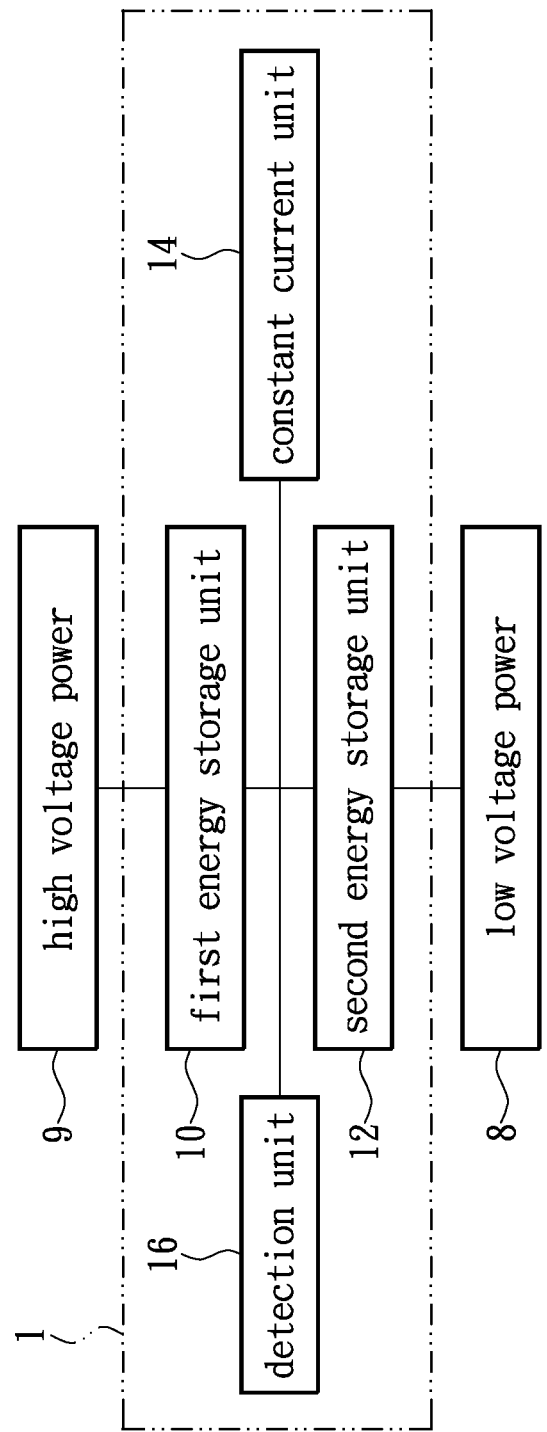
FIG. 1 shows a function block diagram of an insulation detection circuit according to an embodiment of the present disclosure.

In a first embodiment, FIG. 1 shows a function block diagram of an insulation detection circuit according to an embodiment of the disclosure. Please refer to FIG. 1. An insulation detection circuit 1 is suitable for detecting an insulation status between a high voltage power 9 and a low voltage power 8 of a vehicle. The insulation detection circuit 1 is coupled between a vehicle and a direct-current (DC) power, and the DC power is used for providing electric power to the vehicle, or for activating a power generator of the vehicle to provide electric power for the vehicle, so as to relatively form the high voltage power 9 and the low voltage power 8. The insulation detection circuit 1 includes a first energy storage unit 10, a second energy storage unit 12, a constant current unit 14, and a detection unit 16.

Practically, the DC power can be implemented by a rechargeable battery, and the low voltage power 8 can be implemented by grounding the shell of the vehicle or using an electric instrument connection. There is a high impedance or insulation material between the high voltage power 9 and the low voltage power 8 for isolating the two voltage powers, thus the power will not leak from the high voltage power 9 to the low voltage power 8. For example, the electric cable of a head lamp of the vehicle may be covered by an insulation rubber. When the insulation rubber is aging or damaged and thus makes the copper wire of the electric cable in the head lamp of the vehicle be in connection with the shell of the vehicle, electric power will leak from the high voltage power 9 to the low voltage power 8. Therefore, the insulation detection circuit 1 in this disclosure is used for detecting the insulation status between the high voltage power 9 and the low voltage power 8 of the vehicle.

In addition, the high voltage power 9 is, for example, implemented by several serially connected rechargeable batteries. The rechargeable battery includes, for example, a lead-acid battery, a nickel-zinc battery, a nickel-iron battery, or a lithium battery, etc., and is not limited thereto. Practically, several rechargeable batteries are connected in series or in series-parallel for providing DC power to the electric instruments of the vehicle. Of course, the rechargeable battery can retain its electric quantity by means of power generators of the vehicle or voltage converters. Alternatively, the rechargeable battery can provide pulse DC power so as to be used by the electric instruments of the vehicle. The implementation types of the rechargeable battery are not limited in this embodiment.

The first energy storage unit 10 is coupled between the high voltage power 9, the second energy storage unit 12, the constant current unit 14, and the detection unit 16. The first energy storage unit 10 is able to isolate the high voltage power 9 from the low voltage power 8, and can be implemented by a capacitor. Generally speaking, the capacitor can block the DC power from flowing from the high voltage power 9 to the low voltage power 8, thus the capacitor has better isolation property than a resistor.

The second energy storage unit 12 is coupled between the first energy storage unit 10 and the low voltage power 8, and can also be implemented by a capacitor. Generally speaking, the second energy storage unit 12 can store electric power under the condition of low frequency alternating-current (AC) current. Thus, when the insulation between the high voltage power 9 and the low voltage power 8 is damaged, the current leaking from the high voltage power 9 to the low voltage power 8 will conduct, so that the first energy storage unit 10 and the second energy storage unit 12 form a loop. Therefore, the first energy storage unit 10 provides a current division path for the constant current unit 14, and the leakage current and the divided constant current will flow to the loop.

The constant current unit 14 is coupled to the first energy storage unit 10, the second energy storage unit 12, and the detection unit 16. The constant current unit 14 is used for providing a stable and low frequency constant current to the second energy storage unit 12, so as to charge/discharge the second energy storage unit 12. When the current of the second energy storage unit 12 is smaller than a predetermined value, the detection unit 16 detects that the insulation between the high voltage power 9 and the low voltage power 8 is damaged. Practically, the constant current unit 14 can be implemented by a constant current circuit, a current mirror, a constant current diode, a switching power supply, which includes respectively several amplifiers and resistors, or by other coupling circuits including some electric components. Of course, the constant current unit 14 generates a constant current of low frequency AC for charging/discharging the second energy storage unit 12. Thus, the second energy storage unit 12 can receive the constant current so as to be charged/discharged.

For example, the impedances of the first and the second energy storage units 10 and 12 are changed according to the frequency of the AC power provided by the constant current unit 14. When the frequency of the AC power increases, the impedances of the first and the second energy storage units 10 and 12 will reduce. On the other hand, when the frequency of the AC power decreases, the first and the second energy storage units 10 and 12 will increase. Thus, in the present disclosure an AC power of a constant low frequency is used for charging/discharging the second energy storage unit 12 which is coupled to the low voltage power 8. Thus the second energy storage unit 12 can have a constant impedance and an efficacy of not being influenced by the low voltage power 8. Therefore, in the present disclosure the current change of the second energy storage unit 12 can be easily and precisely detected.

When the constant current unit 14 provides the AC power of a constant low frequency to the second energy storage unit 12 for charging/discharging, the impedance of the second energy storage unit 12 may be kept at a same constant value, and the impedance value of the second energy storage unit 12 will not be influenced no matter whether the insulation between the high voltage power 9 and the low voltage power 8 is damaged or not. Thus, the insulation detection circuit 1 may determine the insulation status between the two powers by detecting the current status of the second energy storage unit 12.

Specifically, the constant current unit 14 provides a low frequency constant current for charging the second energy storage unit 12, so that the second energy storage unit 12 receives the constant current normally. When the insulation status is abnormal, the first energy storage unit 10 will provide a current division path for the constant current unit 14, so that the low frequency constant current provided by the constant current unit 14 may be divided to flow into the first energy storage unit 10, thus the constant current received by the second energy storage unit 12 may be much smaller than the constant current received at the normal status. So, the detection unit 16 can easily and precisely detect the current change of the second energy storage unit 12.

It's worth noting that one of the terminals of the first energy storage unit 10 is connected in floating to the high voltage power 9 and electrically interfered by the high voltage power 9, thus the insulation detection precision of a common insulation detection circuit may be influenced. However, in the present disclosure, the constant current unit 14 provides a constant current to the second energy storage unit 12, and the second energy storage unit 12 is made to be coupled between the first energy storage unit 10 and the low voltage power 8, thus the electrical interference of the second energy storage unit 12 caused by the high voltage power 9 is reduced. Therefore, the insulation detection circuit 1 in this disclosure can increase the precision of the insulation detection.

In this embodiment, the detection unit 16 is coupled to the first energy storage unit 10, the second energy storage unit 12, and the constant current unit 14. The detection unit 16 is used for detecting the current status of the second energy storage unit 12. When the insulation between the high voltage power 9 and the low voltage power 8 is damaged and a leakage current is generated, the constant current unit 14 still maintains a stable constant current so as to charge/discharge the second energy storage unit 12, and the first energy storage unit 10 and the second energy storage unit 12 form a loop. Therefore, the second energy storage unit 12 performs charging/discharging in the loop, so that the current status of the second energy storage unit 12 is changed according to the leakage current.

In addition, the detection unit 16 can also detect the voltage status of the second energy storage unit 12. Practically, the voltage level of the second energy storage unit 12 changes according to the constant current, and the detection unit 16 is used for detecting the voltage level changes of the second energy storage unit 12. Of course, the detection unit 16 can also detect the highest voltage level, the lowest voltage level, the highest voltage level and the lowest voltage level, or can output a detection signal which represents that the insulation status is abnormal when the voltage amplitude is smaller than the predetermined value. The one skilled in the art knows the function of detecting the voltage status, thus the function will not be redundantly described herein.

For example, the current of the second energy storage unit 12 is discharged or divided to the first energy storage unit 10, thus the current of the second energy storage unit 12 is smaller than the predetermined value. For example, when the current of the second energy storage unit is smaller than 0.1 A, the detection unit 16 detects that the insulation between the high voltage power 9 and the low voltage power 8 is damaged. Of course, the predetermined value of the current of the second energy storage unit 12 can be modified by those skilled in the art according to actual design requirements.

For example, when the insulation status between the high voltage power 9 and the low voltage power 8 is good, the current flowing through the second energy storage unit 12 is relatively larger, thus the detection unit 16 detects that the current flowing through the second energy storage unit 12 is larger than the predetermined value. Therefore, the present disclosure can determine that no leakage current is generated between the high voltage power 9 and the low voltage power 8.

When the insulation status between the high voltage power 9 and the low voltage power 8 is damaged, the current flowing through the second energy storage unit 12 is relatively lower, thus the detection unit 16 detects that the current flowing through the second energy storage unit 12 is smaller than the predetermined value. Therefore, the detection unit 16 outputs a detection signal which represents that the insulation status is abnormal, so as to determine whether the leakage current is generated between the high voltage power 9 and the low voltage power 8. Therefore, the present disclosure uses the detection circuit formed by the constant current unit 14 and the detection unit 16 for determining whether the insulation status between the high voltage power 9 and the low voltage power 8 is good or not.

It's worth noting that, in other embodiments, the detection unit 16 can be coupled between the second energy storage unit 12 and the low voltage power 8, so that the detection unit 16 can detect the voltage or current changes of the second energy storage unit 12. The embodiments in this disclosure do not limit the implementation types of the detection unit 16. In addition, the detection unit 16 may be coupled to the electric power control system of the vehicle. When the detection unit 16 detects the signals which represent that the insulation between the high voltage power 9 and the low voltage power 8 is damaged, the detection unit 16 can transmit the detection signals through the control area network (CAN), so as to let the display instruments or warning devices of the vehicle output the display or warning signals, in order to protect the users.

Therefore, in the present disclosure the constant current unit 14 generates a constant low-frequency pulse AC power, for charging the second energy storage unit 12. When the insulation between the high voltage power 9 and the low voltage power 8 is damaged, the constant current provided by the constant current unit 14 may be divided to flow into the first energy storage unit 10, and the second energy storage unit 12 may be charged or discharged in the loop, thus the current flowing through the second energy storage unit 12 will change, and the detection unit 16 can detect the insulation status between the high voltage power 9 and the low voltage power 8.

In addition, the first and the second energy storage units 10 and 12 are capacitors which are able to isolate the high voltage power 9 from the low voltage power 8, thus there are good insulations between the high voltage power 9 and the low voltage power 8, and the risk of generating a trace amount of high voltage leakage current will be avoided. Moreover, the detection unit 16 detects the second energy storage unit 12 which is connected with the low voltage power 8, so that the possibility that the second energy storage unit 12 is interfered by the high voltage power 9 is reduced, and the precision of insulation detection is enhanced.

In a second embodiment, the circuit structure of the constant current unit 14 in FIG. 1 may be implemented by different circuits. Of course, the constant current 14 can still provide a stable constant current to the second energy storage unit 12, so that the detection unit 16 can detect the insulation status between the high voltage power 9 and the low voltage power 8.

Figure 2A:
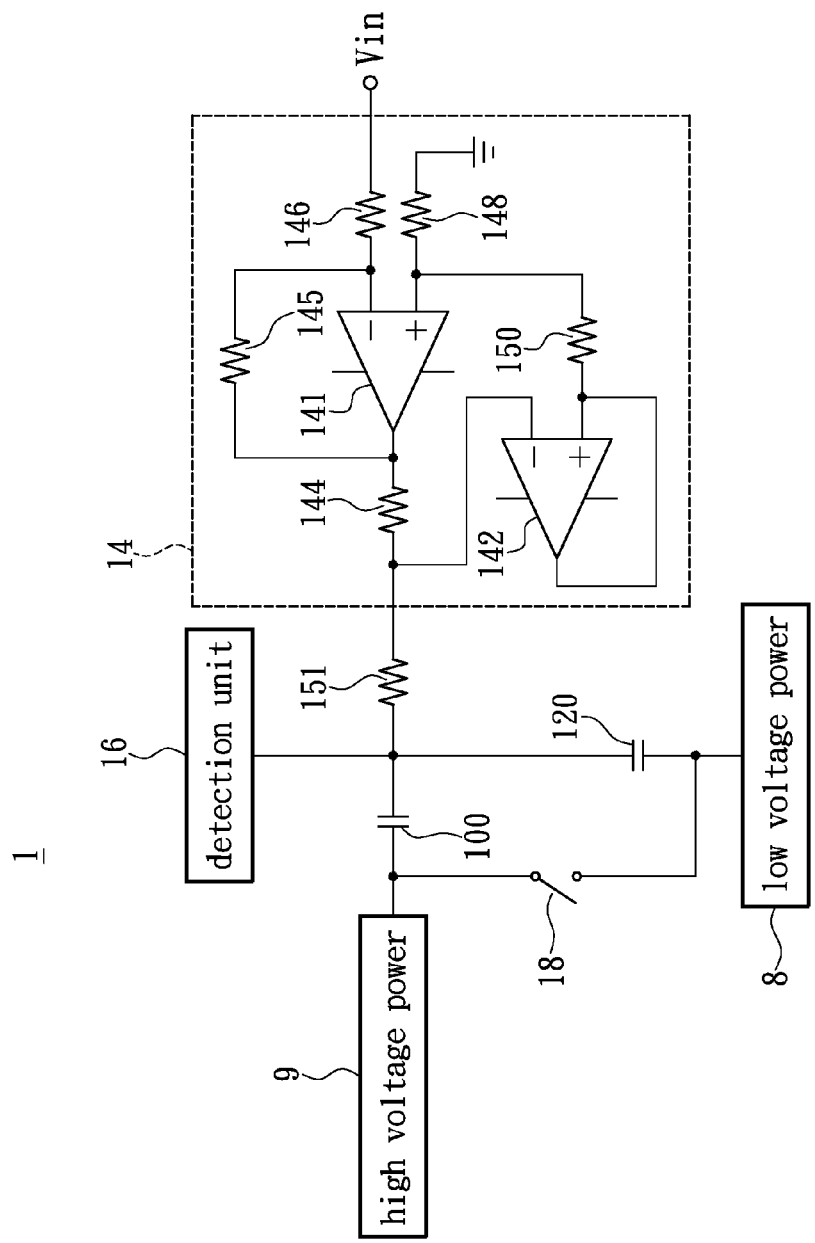
FIG. 2A shows a structural diagram of the insulation detection circuit in FIG. 1 according to an embodiment of the present disclosure.

FIG. 2A shows a circuit structure diagram of an insulation detection circuit according to FIG. 1 of an embodiment of the present disclosure. Please refer to FIG. 2A. For convenience of explanation, the first and the second energy storage units are respectively the first and the second capacitors 100 and 120. The constant current unit 14 includes a first amplifier 141, a second amplifier 142, and a plurality of resistors 144, 145, 146, 148, and 150. The constant current unit 14 is used for outputting a stable constant current to the second capacitor 120. The coupling relations among the first amplifier 141, the second amplifier 142, and the resistors 144, 145, 146, 148, and 150 can be freely designed by the one skilled in the art according to the actual requirements.

The non-inverting input terminal of the first amplifier 141 shown in FIG. 2A is grounded, the inverting input terminal of the first amplifier 141 is coupled to an input voltage Vin, and the output terminal of the first amplifier 141 is coupled between the inverting input terminal of the second amplifier 142 and the detection unit 16. The non-inverting input terminal of the second amplifier 142 is coupled between the non-inverting input terminal of the first amplifier 141 and the output terminal of the second amplifier 142, and the resistors 144, 145, 146, 148, and 150 are coupled to the first amplifier 141 or the second amplifier 142.

For example, the resistor 148 is coupled to the non-inverting input terminal of the first amplifier 141. Because the first amplifier 141 serves as a subtractor, if the input voltage Vin and the resistor 144 are fixed, a constant current will be generated. Of course, in other embodiments, the number and coupling manners of the resistors 144, 145, 146, 148, and 150 can be freely designed by the one skilled in the art according to actual requirement.

Specifically, when the insulation status between the high voltage power 9 and the low voltage power 8 is good, the equivalent switch 18 between the high voltage power 9 and the low voltage power 8 can be regarded as being turned off. For example, the low frequency pulse signal may be provided by the computer of the vehicle to the constant current unit 14, and is processed into a low-frequency pulse constant current by means of the coupled circuit composed of the first amplifier 141, the second amplifier 142, and the resistors 144, 145, 146, 148, and 150. Thus the constant current unit 14 may charge/discharge the coupling second capacitor 120. Therefore, the constant current unit 14 charges/discharges the second capacitor 120 by means of a stable constant current generated by the first amplifier 141, the second amplifier 142, and the resistors 144, 145, 146, 148, and 150.

When the insulation between the high voltage power 9 and the low voltage power 8 is damaged, the equivalent switch 18 between the high voltage power 9 and the low voltage power 8 may be regarded as conducting status. Thus the first and the second capacitors 100 and 120 and the equivalent switch 18 form a loop, and the first capacitor 100 can also receive part of the constant current generated by the constant current unit 14, wherein the constant current is divided to flow into the loop, and the second capacitor 120 is discharged through the loop, thus the charge status of the second capacitor 120 and the current flowing through the second capacitor 120 are changed. Therefore, the detection unit 16 may be able to detect the voltage of the second capacitor 120 or the current flowing through the second capacitor 120, so as to further determine the insulation status between the high voltage power 9 and the low voltage power 8.

Please refer to FIG. 2A again, the first capacitor 100 can isolate the high voltage power 9 from the low voltage power 8. However, one terminal of the first capacitor 100 is coupled to the electric appliance of the high voltage power 9, thus the first capacitor 100 may be influenced by the electrical interference of the high voltage power 9. On the other hand, the present disclosure detects the current or voltage changes of the second capacitor 120. The second capacitor 120 is not influenced by the high voltage power 9, and the high voltage power 9 is effectively isolated by means of the first capacitor 100, thus the precision of the insulation detection circuit 1 is enhanced.

Therefore, in the present disclosure a constant low-frequency pulse AC power is generated by means of the constant current unit 14, so as to charge/discharge the coupling second capacitor 120. When the insulation between the high voltage power 9 and the low voltage power 8 is damaged, the constant current provided by the constant current unit 14 may be divided to flow into the first capacitor 100, and the constant current flowing through the coupling second capacitor 120 may be changed. Thus, by detecting whether the current flowing through the second capacitor 120 is lower than a predetermined value or not, the detection unit 16 can detect the insulation status between the high voltage power 9 and the low voltage power 8.

In addition, the coupling first capacitor 100 can isolate the high voltage power 9 from the low voltage power 8, thus the insulation between the high voltage power 9 and the low voltage power 8 is good, and the risk of generating a trace amount of high voltage leakage current will be avoided. Moreover, the constant current unit 14 provides a low frequency constant current to the coupling second capacitor 120, thus lets the coupling second capacitor 120 receive the constant current in the status of isolating the electrical interference of the high voltage power 9, therefore, the possibility that the coupling second capacitor 120 is interfered by the high voltage power 9 is reduced. Of course, the detection unit 16 detects the current of the second capacitor 120 under the status of isolating the electrical interference of the high voltage power 9, so as to increase the precision of the insulation detection circuit 1.

In this embodiment, when the insulation between the high voltage power 9 and the low voltage power 8 is damaged, the constant current provided by the constant current unit 14 may be divided to flow into the first capacitor 100, and the coupling second capacitor 120 is charged or discharged in the loop. The current division of the constant current makes the highest voltage level and the lowest voltage level of the second capacitor 120 change, thus the detection unit 16 may be able to detect the insulation status between the high voltage power 9 and the low voltage power 8 by detecting whether the highest voltage level, the lowest voltage level, the highest voltage level and the lowest voltage level, or the voltage amplitude is smaller than a predetermined value or not.

Figure 2B:
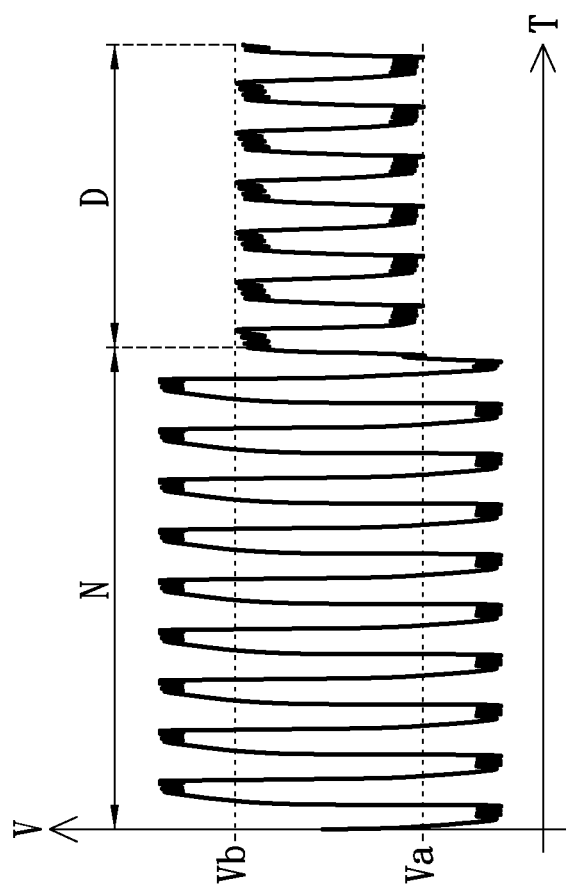
FIG. 2B shows a voltage waveform diagram of the insulation detection circuit in FIG. 2A according to another embodiment of the present disclosure.

In the third embodiment, FIG. 2B is a voltage waveform diagram of the insulation detection circuit of another embodiment of the present disclosure according to FIG. 2A. Please refer to FIG. 2B. FIG. 2B shows the voltage waveform of the second capacitor 120 in a normal status and an abnormal status. When the insulation status between the high voltage power 9 and the low voltage power 8 is normal, the detection unit 16 detects that the voltage waveform of the second capacitor 120 is shown as that in the time period N of FIG. 2B. When the insulation status between the high voltage power 9 and the low voltage power 8 is abnormal, the detection unit 16 detects that the voltage waveform of the second capacitor 120 is shown as that in the time period D of FIG. 2B.

To describe in detail, generally the waveforms of the voltage or current detected by the insulation detection circuit are the ripple waves which have unobvious voltage drop or current difference, thus it's hard for a general insulation detection circuit to precisely detect the voltage or current changes. The present disclosure provides a low-frequency constant current by means of the constant current unit 14 for charging/discharging the second capacitor 120. When the insulation status between the high voltage power 9 and the low voltage power 8 is abnormal, the first and the second capacitors 100 and 120 form a loop, and the constant current provided by the constant current unit 14 is divided to flow into the first capacitor 100 of the loop. At this moment, not all of the constant current is flowing into the second capacitor 120, thus the voltage waveform of the second capacitor 120 may generate a relatively larger voltage drop, such as the voltage waveform shown in the time period D of the FIG. 2B. For example, if the 480 k ohms insulation from the high voltage power 9 side to the low voltage power 8 side is damaged, the detection unit 16 can detect that the voltage Va is 36.8 mV while the voltage Vb is 73.6 mV. Therefore, the detection unit 16 of the insulation detection circuit 1 can easily and precisely detect the abnormal insulation condition.

Figure 3:
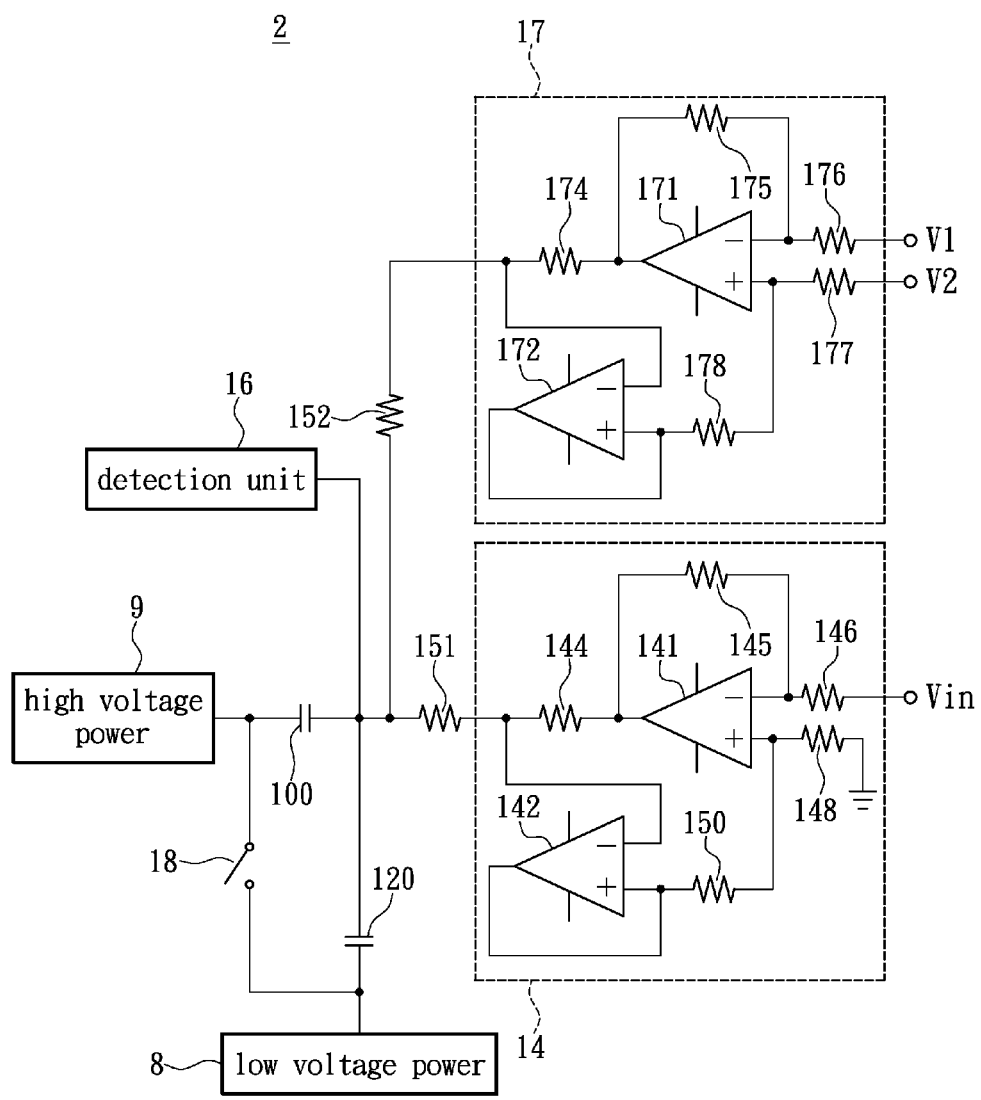
FIG. 3 shows a structural diagram of an insulation detection circuit according to another embodiment of the present disclosure.

In the fourth embodiment, the insulation detection circuit 1 can be implemented by different manners. FIG. 3 shows a circuit structure diagram of an insulation detection circuit according to another embodiment of the present disclosure. Please refer to FIG. 3. The structure of the insulation detection circuit 2 in FIG. 3 is similar to the structure of the insulation detection circuit 1 in FIG. 2A, and in the following descriptions the same symbols are used for representing the same components in both the insulation detection circuits 1 and 2. The difference between the insulation detection circuits 1 and 2 consists in that the insulation detection circuit 2 further has a constant current compensation unit 17. The constant current compensation unit 17 includes a third amplifier 171, a fourth amplifier 172, and a plurality of resistors 174, 175, 176, 177, and 178. The present embodiment does not limit the implementation types of the constant current compensation unit 17.

Specifically, the inverting input terminal of the third amplifier 171 is coupled to a first input voltage V1, and the non-inverting input terminal of the third amplifier 171 is coupled to a second input voltage V2, such as the first and the second input voltage V1 and V2 provided by the computer of the vehicle. The output terminal of the third amplifier 171 is coupled between the inverting input terminal of the fourth amplifier 172, the constant current unit 14, and the detection unit 16. The non-inverting input terminal of the fourth amplifier 172 is coupled between the non-inverting input terminal of the third amplifier 171 and the output terminal of the fourth amplifier 172. The resistors 174, 175, 176, 177, and 178 are coupled to the third amplifier 171 or the fourth amplifier 172, as shown in FIG. 3. Thus, the constant current compensation unit 17 can compensate the losses in circuit of the constant current unit 14.

For example, the constant current unit 14 outputs the constant current to the second capacitor 120. The path from the constant current unit 14 to the second capacitor 120 has an impedance 151, and the impedance 151 may cause the losses of current. The constant current compensation unit 17 is used for compensating the losses of the current. Therefore, the insulation detection circuit 2 may be able to detect the current value of the second capacitor 120 more precisely.

Figure 4:
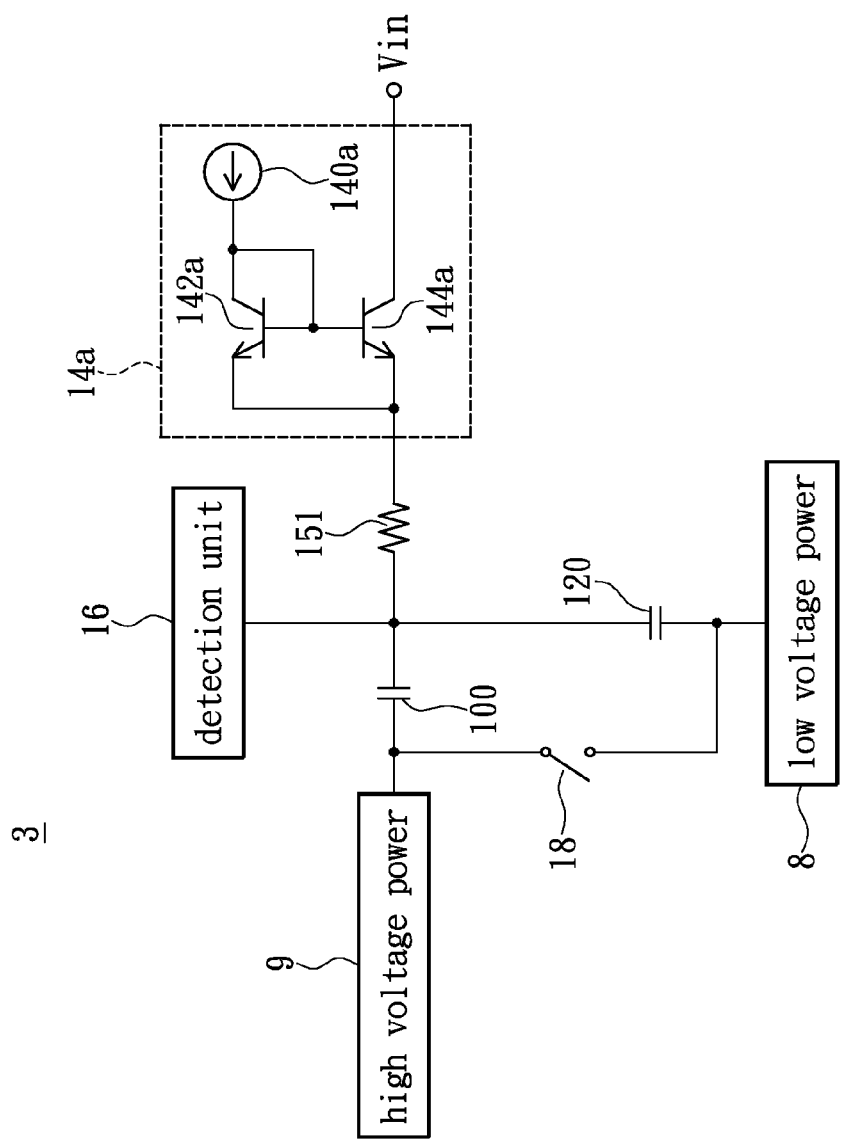
FIG. 4 shows a structural diagram of an insulation detection circuit according to another embodiment of the present disclosure.

In the fifth embodiment, FIG. 4 is a circuit structure diagram of an insulation detection circuit according to another embodiment of the present disclosure. Please refer to FIG. 4. The insulation detection circuit 3 is similar to the insulation detection circuit 1 in the second embodiment. For example, the insulation detection circuit 3 can also provide constant current to the second capacitor 120, thus the detection unit 16 may be able to detect the changes of the current value of the second capacitor 120. However, there still exists difference between the insulation detection circuits 1 and 3, and the difference consists in that the constant current unit 14a is implemented through the circuit structure of a current mirror.

Specifically, the constant current unit 14a includes a current source 140a, a first transistor 142a, and a second transistor 144a. The first and the second transistors 142a and 144a are, for example, the power transistors, the field-effect transistors, or the bipolar junction transistors, and the present embodiment does not limit the implementation types of the first and the second transistors 142a and 144a. Practically, the current source 140a is coupled to the collector node of the first transistor 142a, and the base node of the first transistor 142a is coupled to the base node of the second transistor 144a. Moreover, the wire is coupled between the base nodes of the first and the second transistors 142a and 144a and coupled to the collector node of the first transistor 142a, so as to generate a mirror reflection current. The present embodiment does not limit the implementation types of the current mirror.

Figure 5:
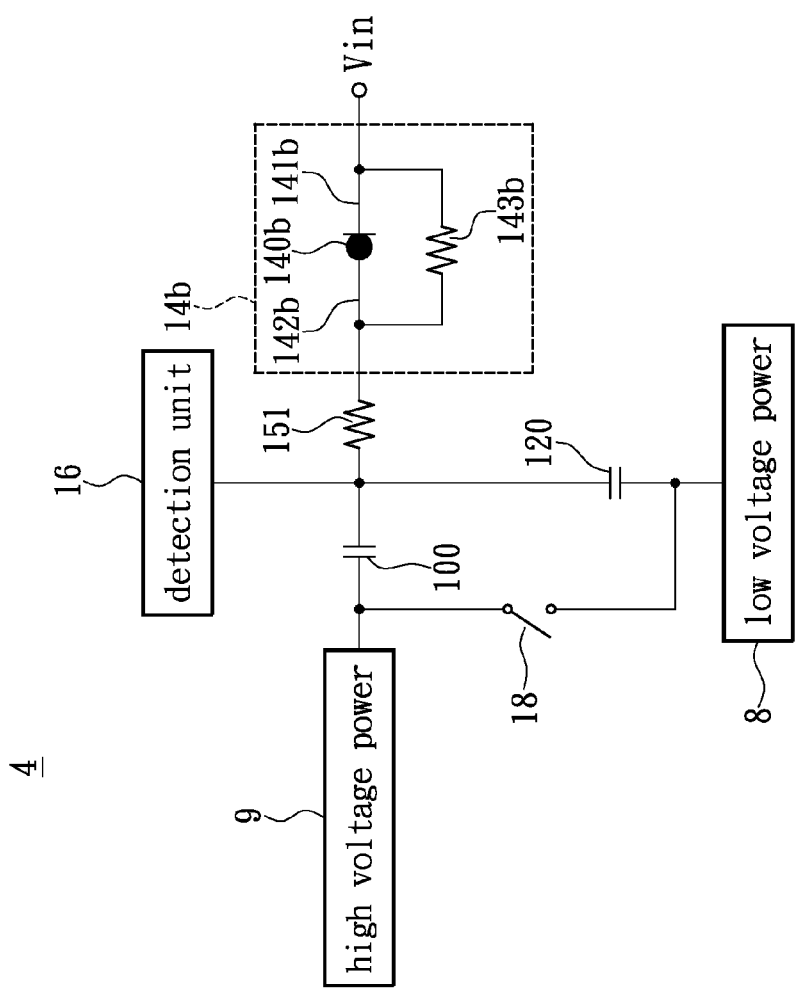
FIG. 5 shows a structural diagram of an insulation detection circuit according to another embodiment of the present disclosure.

In the sixth embodiment, FIG. 5 shows a structure diagram of an insulation detection circuit according to another embodiment of the present disclosure. Please refer to FIG. 5, the insulation detection circuit 4 in this embodiment is similar to the insulation detection unit 1 in the above embodiment. For example, the insulation detection circuit 4 can also provide a constant current to the second capacitor 120, thus the detection unit 16 may be able to detect the changes of the current of the second capacitor 120. However, there still exists difference between the insulation detection circuits 1 and 4, and such difference consists in that the constant current unit 14b can be implemented by a constant current diode 140b.

The constant current unit 14b includes a current input terminal 141b, a current output terminal 142b, a constant current diode 140b, and a resistor 143b, and the resistor 143b and the constant current diode 140b are connected in parallel, as shown in FIG. 5. The current input terminal 141b is electrically connected with the input voltage Vin, such as the input voltage Vin provided by the computer of the vehicle. The anode of the constant current diode 140b is electrically connected with current input terminal 141b, and the cathode of the constant current diode 140b is electrically connected with the current output terminal 142b. The resistor 143b is connected in parallel with the constant current diode 140b. In other embodiments, the resistor 143b can be replaced by an inductor or a capacitor, for adjusting the current outputted by the constant current unit 14b. The present embodiment does not limit the implementation types of the constant current unit 14b.

For example, when the input voltage Vin generates a half period waveform, the current will be transmitted from the current input terminal 141b to the constant current diode 140b, and then will be outputted to the second capacitor 120 through the current output terminal 142b. The properties of the constant current diode 140b include that if it receives a forward voltage, it will output a rated value of current, no matter how much the voltage is. Therefore, identical current is acquired so long as the value of the voltage lies within the standard of the constant current diode 140b. Thus, after adding the constant current diode 140b, even if the AC voltage generates 10% voltage change, the current will not change due to the voltage change, and the efficacy of outputting a stable constant current is achieved.

Figure 6:
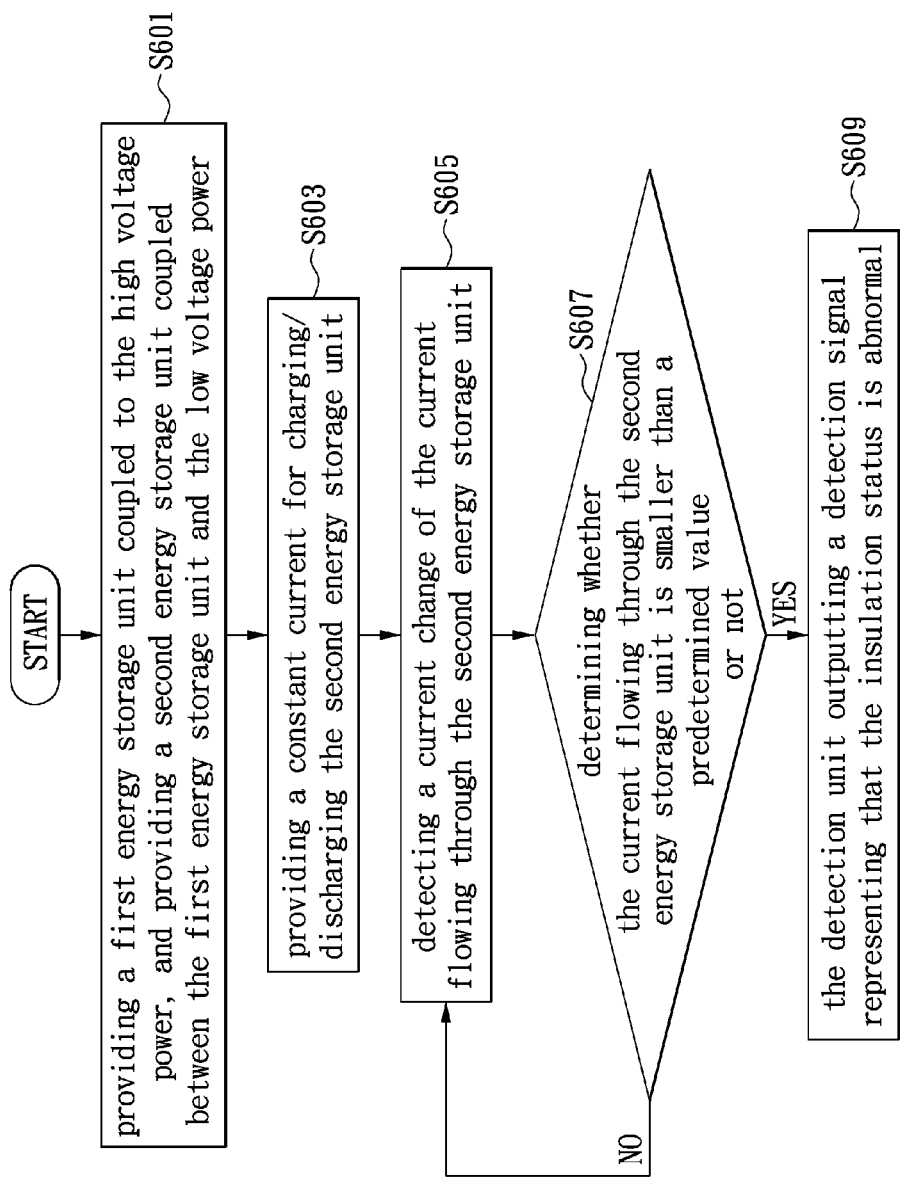
FIG. 6 shows a flow chart of an insulation detection method according to another embodiment of the present disclosure.

In the seventh embodiment, FIG. 6 shows a flow chart of an insulation detection method according to another embodiment of the present disclosure. Please refer to FIG. 6, an insulation detection method is disclosed. The method is suitable for detecting an insulation status between a high voltage power and a low voltage power of a vehicle. The insulation detection method include: at first, in the step S601, providing a first energy storage unit coupled to the high voltage power, and providing a second energy storage unit coupled between the first energy storage unit and the low voltage power.

Then in step S603, the method includes providing a constant current for charging/discharging the second energy storage unit. In step S605, the method includes detecting the current changes of the current flowing through the second energy storage unit. In step S607, the method includes determining whether the current flowing through the second energy storage unit is smaller than a predetermined value or not. If the current flowing through the second energy storage unit is smaller than the predetermined value, the step S609 is then executed, and the detection unit outputs a detection signal representing that the insulation status is abnormal. If the current is not smaller than the predetermined value, the method then goes back to the step S605, and the detection unit continuously detects the current changes of the current flowing through the second energy storage unit.

It's worth noting that, the step S605 further includes that the voltage level of the second energy storage unit changes according to the constant current, thus the detection unit can also detect the voltage level changes of the second energy storage unit. Therefore, the step S607 may further include determining whether the highest voltage level, the lowest voltage level, the highest and the lowest voltage levels, or the voltage amplitude is smaller than a predetermined value or not. If so, the step S609 is then executed, and the detection signal representing that the insulation status is abnormal is outputted. If not, the step S605 is then executed. The present embodiment does not limit the implementation types of the insulation detection method.

Figure 7A:
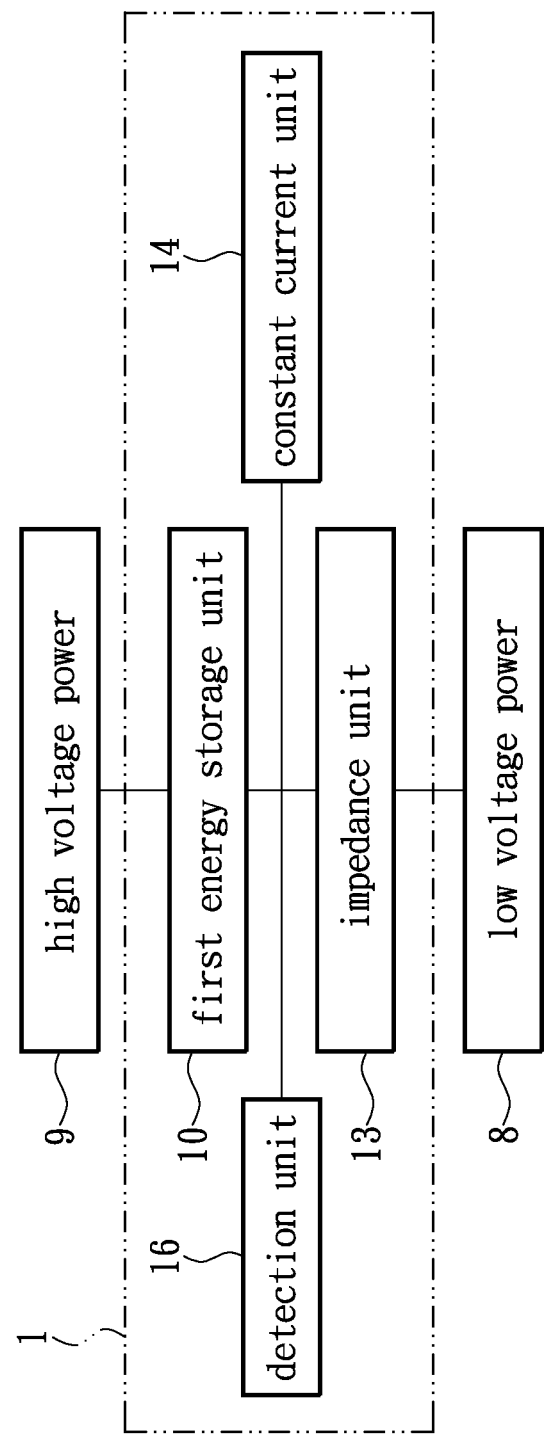
FIG. 7A shows a function block diagram of an insulation detection circuit according to another embodiment of the present disclosure.
Figure 7B:
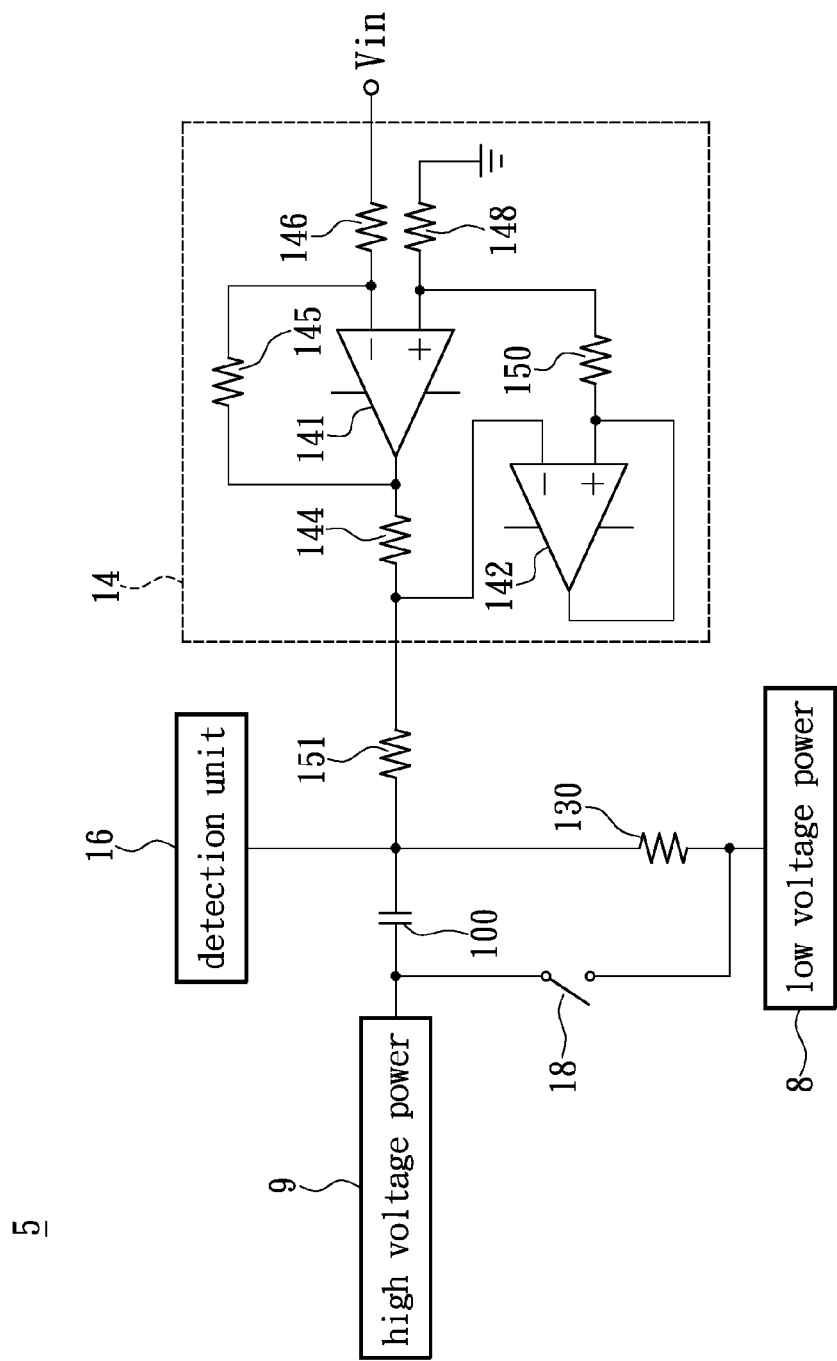
FIG. 7B shows a structural diagram of the insulation detection circuit in FIG. 7A according to another embodiment of the present disclosure.

In the eighth embodiment, FIG. 7A shows a function block diagram of an insulation detection circuit according to another embodiment of the present disclosure. FIG. 7B is a structural diagram of the insulation detection circuit of another embodiment of the present disclosure according to FIG. 7A. Please refer to FIGS. 7A and 7B. The insulation detection circuit 5 in this embodiment is similar to the insulation detection circuit 1 in the above embodiment, for example, the insulation detection circuit 5 can also provide the constant current to the impedance unit 13, thus the detection unit 16 can be able to detect the current changes of the impedance unit 13. However, there still exists difference between the insulation detection circuits 1 and 5, and the difference consists in that the insulation detection circuit 5 uses an impedance unit 13 for replacing the second energy storage unit, and the impedance unit 13 is coupled between the first energy storage unit 10 and the low voltage power 8.

Practically, the impedance unit 13 is used for attenuating the voltage. When the insulation between the high voltage power 9 and the low voltage power 8 is damaged, the impedance unit 13 may cause a voltage drop between the high voltage power 9 and the low voltage power 8, thus the detection unit 16 may be able to detect the current changes of the impedance unit 13.

Specifically, the constant current unit 14 provides a constant current to pass through the impedance unit 13. The detection unit 16 detects the current changes of the current flowing through the impedance unit 13. When the detection unit 16 detects that the current flowing through the impedance unit 13 is smaller than a predetermined value, then a detection signal representing that the insulation status is abnormal is outputted.

Please refer to FIGS. 7A and 7B again, the first energy storage unit 10 is a first capacitor 100, and the impedance unit 13 is a resistor 130. The resistor 130 is coupled between the first capacitor 100 and the low voltage power 8. When the insulation between the high voltage power 9 and the low voltage power 8 is damaged, the constant current will be divided to flow into the first capacitor 100, and the first capacitor 100 and the resistor 130 form an RC loop, so that the current flowing through the resistor 130 is smaller than the predetermined value.

On the basis of the above, the present disclosure provides an insulation detection circuit, which provides a stable constant current to the second energy storage unit for charging/discharging it. When the constant current is divided to flow into the first energy storage unit, the current flowing through the second energy storage unit will be smaller than a predetermined value, thus the detection unit can be able to precisely detect that the insulation between the high voltage power and the low voltage power of the vehicle is damaged. Therefore, the present disclosure is able to increase the usage convenience of the insulation detection circuit, and can achieve the aforementioned objects.

Some modifications of these examples, as well as other possibilities will, on reading or having read this description, or having comprehended these examples, occur to those skilled in the art. Such modifications and variations are comprehended within this disclosure as described here and claimed below. The description above illustrates only a relative few specific embodiments and examples of the present disclosure. The present disclosure, indeed, does include various modifications and variations made to the structures and operations described herein, which still fall within the scope of the present disclosure as defined in the following claims.

What is claimed is:

1. An insulation detection circuit, suitable for detecting an insulation status between a high voltage power and a low voltage power of a vehicle, the insulation detection circuit comprising:

a first energy storage unit, coupled to the high voltage power;

a second energy storage unit, coupled between the first energy storage unit and the low voltage power;

a constant current unit, coupled between the first energy storage unit and the second energy storage unit, and providing a constant current to charge/discharge the second energy storage unit; and a detection unit, coupled to the second energy storage unit, for detecting a current change of the second energy storage unit;

wherein when the insulation between the high voltage power and the low voltage power is not damaged, only the second energy storage unit receives the constant current and the detection unit detects that a current flowing through the second energy storage unit is not smaller than a predetermined value; and wherein when the detection unit detects that a current flowing through the second energy storage unit is smaller than the predetermined value, the detection unit outputs a detection signal which represents that the insulation between the high voltage power and the low voltage power is damaged, and the first energy storage unit and the second energy storage unit form a loop such that the current of the constant current unit is divided to the first energy storage unit.

2. The insulation detection circuit according to claim 1, wherein the constant current unit includes a first amplifier, a second amplifier, and a plurality of resistors.

3. The insulation detection circuit according to claim 2, wherein a non-inverting input terminal of the first amplifier is grounded or connected with the low voltage power, an inverting input terminal of the first amplifier is coupled to an input voltage, an output terminal of the first amplifier is coupled between an inverting input terminal of the second amplifier and the detection unit, a non-inverting input terminal of the second amplifier is coupled between the non-inverting input terminal of the first amplifier and an output terminal of the second amplifier, and the resistors are coupled to the first amplifier or the second amplifier.

4. The insulation detection circuit according to claim 1, wherein the first energy storage unit is a first capacitor, and the second energy storage unit is a second capacitor.

5. The insulation detection circuit according to claim 4, wherein when insulation between the high voltage power and the low voltage power is damaged, the constant current is divided to flow into the first capacitor to charge or discharge the second capacitor so that a highest voltage level and a lowest voltage level of the second capacitor change.

6. The insulation detection circuit according to claim 4, wherein the first capacitor isolates an electrical interference of the high voltage power, so that the second capacitor receives the constant current under a condition of isolating the electrical interference of the high voltage power, and the detection unit detects the current of the second capacitor under the condition of isolating the electrical interference of the high voltage power.

7. The insulation detection circuit according to claim 1, wherein a voltage level of the second energy storage unit changes according to the constant current, and the detection unit is used for detecting a voltage level change of the second energy storage unit.

8. The insulation detection circuit according to claim 7, wherein when the detection unit detects that a highest voltage level, a lowest voltage level, the highest voltage level and the lowest voltage level, or a voltage amplitude is smaller than the predetermined value, the detection unit outputs the detection signal representing that the insulation status is abnormal.

9. The insulation detection circuit according to claim 1, wherein the constant current unit provides the constant current in low frequency to the second energy storage unit.

10. The insulation detection circuit according to claim 1, further comprising a constant current compensation unit, coupled between the second energy storage unit and the constant current unit, and the constant current compensation unit including a third amplifier, a fourth amplifier, and a plurality of resistors.

11. The insulation detection circuit according to claim 10, wherein a non-inverting input terminal of the third amplifier is coupled to a first input voltage, an inverting input terminal of the third amplifier is coupled to a second input voltage, an output terminal of the third amplifier is coupled among an inverting input terminal of the fourth amplifier, the constant current unit, and the detection unit, a non-inverting input terminal of the fourth amplifier is coupled between the non-inverting input terminal of the third amplifier and an output terminal of the fourth amplifier, and the resistors are coupled to the third amplifier or the fourth amplifier.

12. The insulation detection circuit according to claim 1, wherein the constant current unit is selected from the group consisting of a current mirror, a constant current diode, and a switching power supply.

13. An insulation detection method, suitable for detecting an insulation status between a high voltage power and a low voltage power of a vehicle, the insulation detection method comprising:
providing a first energy storage unit coupled to the high voltage power, and providing a second energy storage unit coupled between the first energy storage unit and the low voltage power;
providing a constant current for charging/discharging the second energy storage unit;
detecting a current change of the second energy storage unit; and
when the insulation between the high voltage power and the low voltage power is not damaged, only the second energy storage unit receives the constant current and the detection unit detects that a current flowing through the second energy storage unit is not smaller than a predetermined value; and
when detecting that a current flowing through the second energy storage unit is smaller than the predetermined value, outputting a detection signal representing that the insulation between the high voltage power and the low voltage power is damaged; and
forming a loop of the first energy storage unit and the second energy storage unit such that the current of the constant current unit is divided to the first energy storage unit.

14. The insulation detection method according to claim 13, wherein in the step of detecting the current change of the second energy storage unit the method further includes:
detecting a voltage level change of the second energy storage unit, wherein the voltage level of the second energy storage unit changes according to the constant current.

15. The insulation detection method according to claim 13, wherein when detecting that the current flowing through the second energy storage unit is smaller than a predetermined value, outputting a detection signal representing that the insulation status is abnormal, the step described above further including:
when detecting that a highest voltage level, a lowest voltage level, the highest voltage level and the lowest voltage level, or a voltage amplitude is smaller than the predetermined value, outputting the detection signal representing that the insulation status is abnormal.

16. An insulation detection circuit, suitable for detecting an insulation status between a high voltage power and a low voltage power of a vehicle, the insulation detection circuit comprising:
a first energy storage unit, coupled to the high voltage power;
an impedance unit, coupled between the first energy storage unit and the low voltage power;
a constant current unit, coupled between the first energy storage unit and the impedance unit, for providing a constant current to flow through the impedance unit; and
a detection unit, coupled to the impedance unit, for detecting a current change of the current flowing through the impedance unit;
wherein when the insulation between the high voltage power and the low voltage power is not damaged, only the second energy storage unit receives the constant current and the detection unit detects that a current flowing through the second energy storage unit is not smaller than a predetermined value; and wherein when insulation between the high voltage power and the low voltage power is damaged, the constant current is divided to flow into the first capacitor, and the first capacitor and the impedance unit form a loop, so that the current flowing through the impedance unit is smaller than the predetermined value;

wherein when the detection unit detects that a current flowing through the impedance unit is smaller than a predetermined value, the detection unit outputs a detection signal representing that the insulation between the high voltage power and the low voltage power is damaged, and the first energy storage unit and the second energy storage unit form a loop such that the current of the constant current unit is divided to the first energy storage unit.

17. The insulation detection circuit according to claim 16, wherein the first energy storage unit is a first capacitor, and the impedance unit is a resistor.

\* \* \* \* \*